(12) United States Patent
Choi

(10) Patent No.: US 8,923,047 B2
(45) Date of Patent: Dec. 30, 2014

(54) SEMICONDUCTOR MEMORY DEVICE

(71) Applicant: SK Hynix Inc., Gyeonggi-do (KR)

(72) Inventor: Sang Moo Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 97 days.

(21) Appl. No.: 13/716,068

(22) Filed: Dec. 14, 2012

(65) Prior Publication Data

US 2014/0043915 A1  Feb. 13, 2014

(30) Foreign Application Priority Data

Aug. 10, 2012  (KR) .................. 10-2012-0087745

(51) Int. Cl.
*G11C 11/34* (2006.01)
*G11C 16/10* (2006.01)

(52) U.S. Cl.
CPC ...................................... *G11C 16/10* (2013.01)
USPC ................... 365/185.05; 365/63; 365/185.17; 365/185.14; 365/185.11

(58) Field of Classification Search
CPC ...................................................... G11C 16/10
USPC ........ 365/185.05, 6, 185.17, 185.14, 185.113
See application file for complete search history.

(56) References Cited

U.S. PATENT DOCUMENTS

| | | | | |
|---|---|---|---|---|
| 7,203,092 B2* | 4/2007 | Nazarian | ................... | 365/185.17 |
| 7,457,166 B2* | 11/2008 | Hemink et al. | .......... | 365/185.29 |
| 7,773,429 B2* | 8/2010 | Jeon et al. | ................ | 365/185.28 |
| 8,427,881 B2* | 4/2013 | Jang et al. | ................ | 365/185.25 |
| 8,492,975 B2* | 7/2013 | Kim | ............................... | 313/512 |
| 8,576,629 B2* | 11/2013 | Choe et al. | ............... | 365/185.18 |
| 2011/0051527 A1 | 3/2011 | Kirisawa et al. | | |
| 2013/0163345 A1* | 6/2013 | Ahn et al. | ................ | 365/185.23 |

FOREIGN PATENT DOCUMENTS

KR  1020120130939  12/2012

* cited by examiner

*Primary Examiner* — Viet Q Nguyen
(74) *Attorney, Agent, or Firm* — IP & T Group LLP

(57) ABSTRACT

A semiconductor memory device includes memory strings each of which includes a drain select transistor, memory cells, and a source select transistor, a first bit line coupled to drain select transistors of first group memory strings among the memory strings, a second bit line coupled to drain select transistors of second group memory strings among the memory strings, and source lines coupled to source select transistors of the memory strings; and peripheral circuits configured to turn on source select transistors of non-selected memory strings coupled to source lines to which a precharge voltage is supplied or turn on drain select transistors of non-selected memory strings coupled to bit lines to which a program inhibition voltage is supplied in order to precharge channel regions of non-selected memory strings before a program voltage is supplied to a memory cell included in a selected memory string among the memory strings.

21 Claims, 12 Drawing Sheets

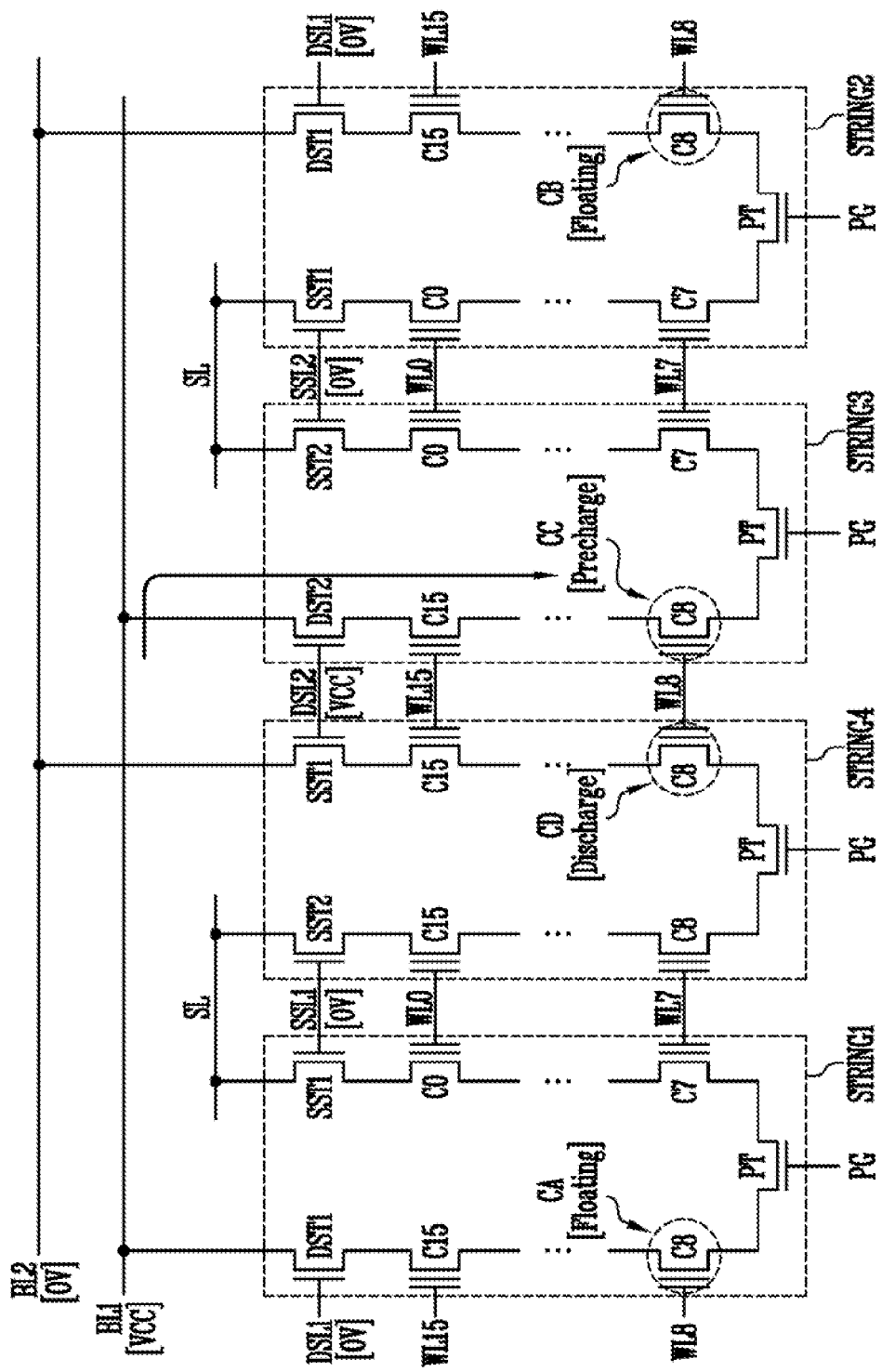

SEMICONDUCTOR MEMORY DEVICE

CROSS-REFERENCE TO RELATED APPLICATION

This application is based on and claims priority from Korean Patent Application No. 10-2012-0087745, filed on Aug. 10, 2012, with the Korean Intellectual Property Office, the disclosure of which is incorporated herein in its entirety by reference.

BACKGROUND

1. Field

Exemplary embodiments of the present invention relate to a semiconductor memory, and more particularly, to a semiconductor memory device including a memory block having a three-dimensional structure.

2. Discussion of Related Art

A non-volatile memory device is a memory device in which stored data is maintained even though power supply is cut off. Since improvement of integration of a memory device having a two-dimensional structure in which the memory device is manufactured in a single layer on a silicon substrate has recently reached the limit, a non-volatile memory device having a three-dimensional structure in which memory cells are substantially perpendicularly stacked on a silicon substrate has been suggested.

In forming the memory cells in the three-dimensional structure, various structures according to an operation condition have been suggested, and an operation condition may be readjusted in order to improve an electrical characteristic according to the suggested structure. Accordingly, the three-dimensional structure of the memory block including the stacked memory cells and an operation method needs to be optimized to each other.

SUMMARY

Exemplary embodiments of the present invention have been made in an effort to provide a semiconductor memory device capable of optimizing a memory block having a three-dimensional structure and an operation method.

An embodiment of the present invention provides a semiconductor memory device, including memory strings each of which includes a drain select transistor, memory cells, and a source select transistor substantially perpendicularly disposed over a substrate, a first bit line coupled to drain select transistors of first group memory strings among the memory strings, a second bit line coupled to drain select transistors of second group memory strings among the memory strings, source lines coupled to the source select transistors of the memory strings, and peripheral circuits configured to turn on source select transistors of non-selected memory strings coupled to source lines to which a precharge voltage is supplied, or turn on a drain select transistor of non-selected memory strings coupled to bit lines to which a program inhibition voltage is supplied in order to precharge channel regions of non-selected memory strings before a program voltage is supplied to a memory cell included in a selected memory string among the memory strings.

Another embodiment of the present invention provides a semiconductor memory device, including memory strings each of which includes a drain select transistor, memory cells, and a source select transistor substantially perpendicularly connected on a substrate, bit lines coupled to drain select transistors included in the memory strings, source lines coupled to source select transistors included in the memory strings, respectively, and peripheral circuits configured to supply a precharge voltage to the source lines and turn on source select transistors of non-selected memory strings in order to precharge channel regions of the non-selected memory strings before a program voltage is supplied to a memory cell included in a selected memory string among the memory strings.

Another embodiment of the present invention provides a semiconductor memory device, including memory strings each of which connects a drain select transistor, memory cells, and a source select transistor in series, a first bit line coupled to drain select transistors of first group memory strings among the memory strings, a second bit line coupled to drain select transistors of second group memory strings among the memory strings, and source lines coupled to source select transistors of the memory strings, respectively. The memory cells of non-selected memory strings among the memory strings are in precharge state or in floating state, before a program voltage is supplied to a memory cell of a selected memory string.

According to the embodiment of the present invention, an operation characteristic may be improved by optimizing a memory block having a three-dimensional structure and an operation method thereof.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIG. 3 is a circuit diagram for illustrating an embodiment of the memory block having the three-dimensional structure illustrated in FIGS. 2A and 2B;

DETAILED DESCRIPTION

Hereinafter, embodiments of the present invention will be described with reference to the accompanying drawings in detail. However, the present invention is not limited to embodiments disclosed below and may be implemented in various forms and the scope of the present invention is not limited to the following embodiments. Rather, embodiments are provided to more fully disclose the present invention and to completely transfer the spirit of the present invention to those skilled in the art to which the present invention pertains, and the scope of the present invention should be understood by the claims of the present invention. In this specification, 'connected/coupled' represents that one component is directly coupled to another component or indirectly coupled through another component. In addition, a singular form may include a plural form as long as it is not specifically mentioned in a sentence.

Figure 1:
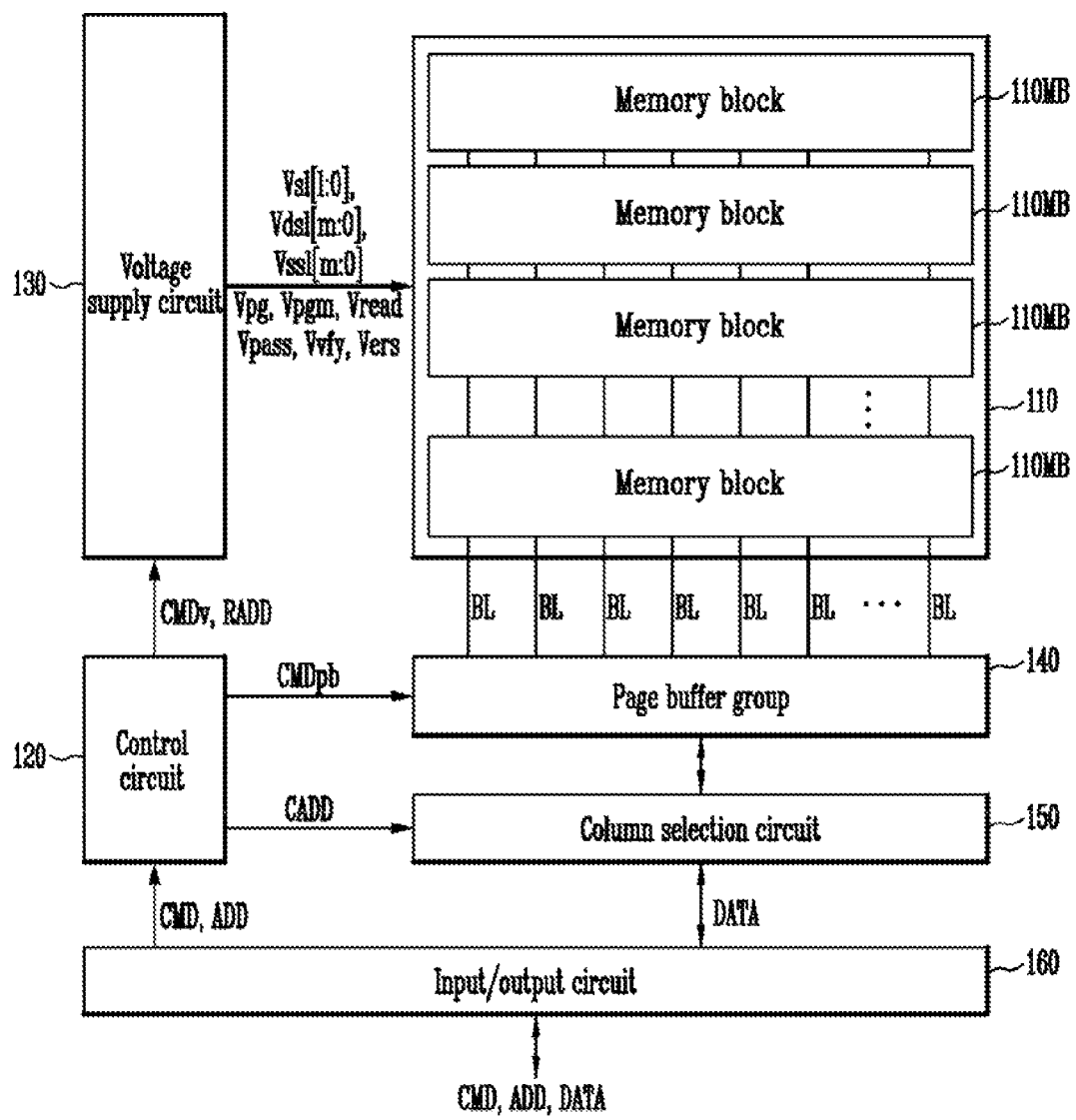
FIG. 1 is a block diagram for illustrating a semiconductor memory device according to an embodiment of the present invention.

FIG. 1 is a block diagram illustrating a semiconductor memory device according to an embodiment of the present invention.

Referring to FIG. 1, a semiconductor memory device may include a memory array 110 and peripheral circuits 120, 130, 140, 150, and 160. The peripheral circuits may include the control circuit 120 and operation circuits 130, 140, 150, and 160. In a case of a flash memory device, the operation circuit may include the control circuit 120, the voltage supply circuit 130, the page buffer group 140, the column selection circuit 150, and the input/output circuit 160.

The memory array 110 includes a plurality of memory blocks 110MB. Each memory block 110MB may be implemented in a three-dimensional structure including a plurality of memory cells stacked on a semiconductor substrate, and especially, may include a plurality of memory strings including U-shaped channel layers. A structure of the memory block 110MB will be described in detail below.

Figure 2A:
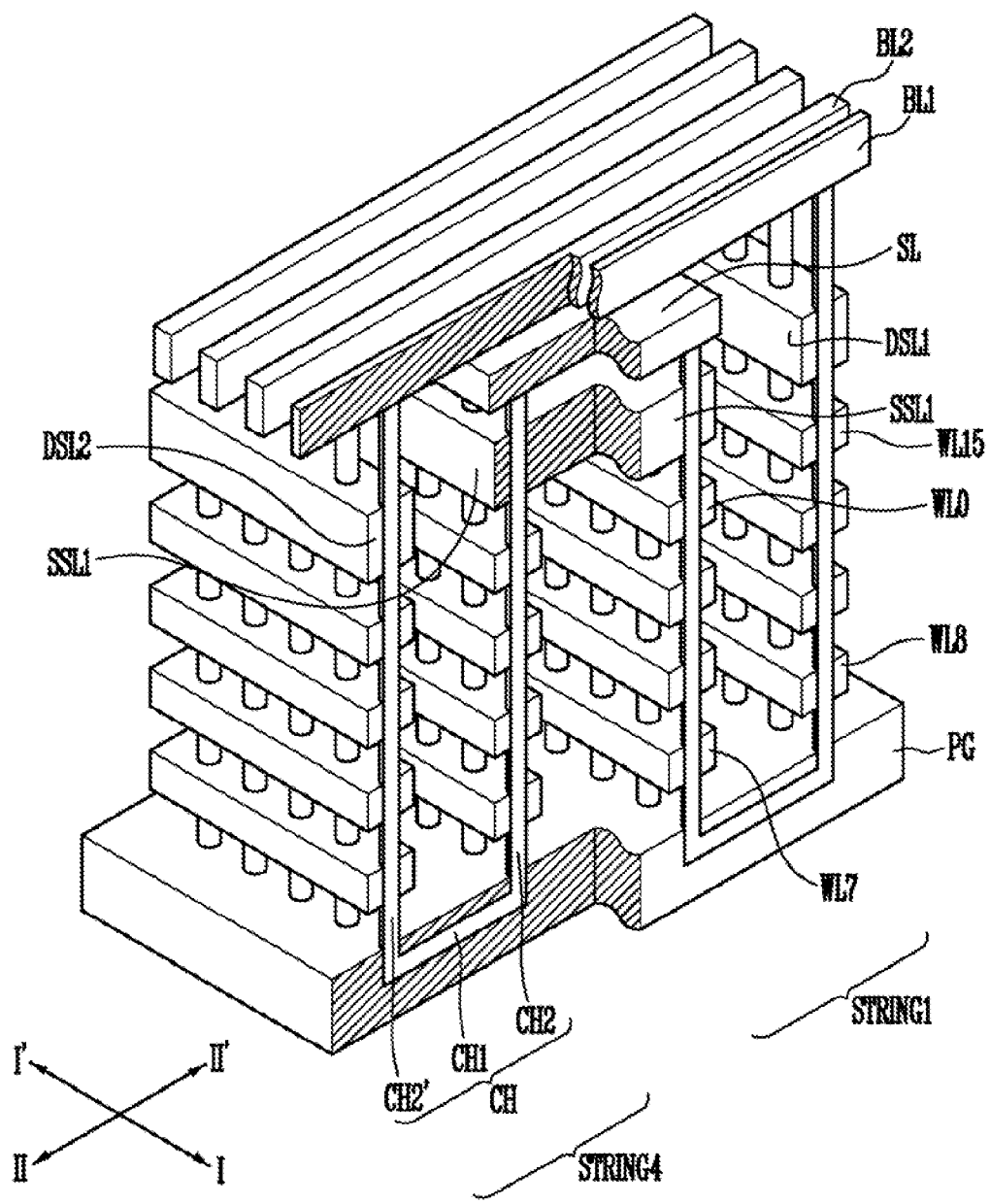
FIGS. 2A and 2B are views for illustrating an embodiment of a memory block having a three-dimensional structure illustrated in FIG. 1.
Figure 2B:
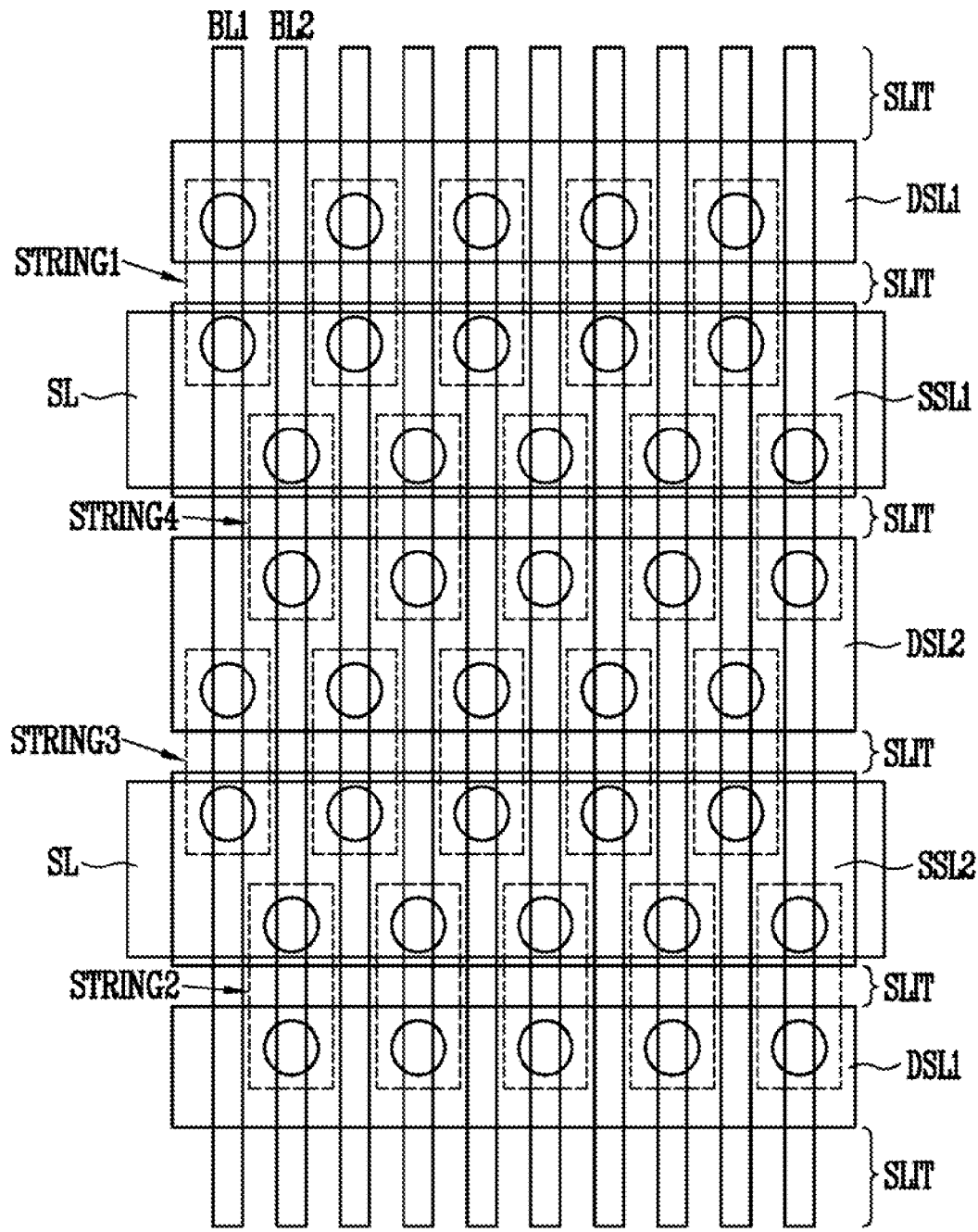

FIGS. 2A and 2B are views for illustrating an embodiment of a memory block having a three-dimensional structure illustrated in FIG. 1. FIG. 3 is a circuit diagram for illustrating an embodiment of the memory block having the three-dimensional structure illustrated in FIGS. 2A and 2B.

Referring to FIGS. 2A, 2B, and 3, the memory block includes memory strings STRING1 to STRING4, bit lines BL1 and BL2, and source lines SL.

Each of the memory strings STRING1 to STRING4 includes a source select transistor SST1, memory cells C0 to C15, and a drain select transistor DST1 substantially perpendicularly connected on the substrate.

The first bit line BL1 is connected with drain select transistors DST1 and DST2 of the first group memory strings STRING1 and STRING 3 among the memory strings STRING 1 to STRING 4. The second bit line BL2 is connected with the drain select transistors DST1 and DST2 of the second group memory strings STRING2 and STRING 4 among the memory strings STRING 1 to STRING 4. The source line SL is connected with source select transistors SST1 and SST2 of the memory strings STRING1 to STRING4.

The first group memory strings STRING1 and STRING3 connected with the first bit line BL1 and the second group memory strings STRING2 and STRING4 connected with the second bit line BL2 may be arranged to be inconsistent with each other on a plane. Further, the first group memory strings STRING1 and STRING3 and the second group memory strings STRING2 and STRING4 may be arranged in a symmetrical structure.

In the meantime, the memory strings STRING1 to STRING4 may further include pipe transistors PT formed on the substrate. In this case, partial memory cells C8 to C15 among the memory cells C0 to C15 are substantially perpendicularly connected between the pipe transistor PT and the drain select transistor DST1, and the remaining memory cells C0 to C7 may be substantially perpendicularly connected between the pipe transistor PT and the source select transistor SST1. Pipe gates PG of the pipe transistors PT may be connected with each other within the memory block.

The memory cells C0 to C15 included in the memory strings STRING1 to STRING4 may share word lines WL0 to WL15. Here, word lines WL0 to WL7 of the cells C0 to C7, which are connected between the pipe transistor PT and the source select transistor SST1, may be called source side word lines, and word lines WL8 to WL15 of the cells C8 to C15, which are connected between the pipe transistor PT and the drain select transistor DST1, may be called drain side word lines.

Corresponding lines between the source side word lines WL0 to WL7 and the drain side word lines WL8 to WL15 within the memory block are formed on the same layer, but are separated by slits SLIT. However, the gates DSL1 and DSL2 of the drain select transistors DST1 and DST2, which are connected to the same bit line (for example, bit line BL1), are separated. Further, the gates SSL1 and SSL2 of the source select transistors SST1 and SST2 are connected with each other within the memory block.

The bit lines BL1 and BL2 and the source line SL may be formed in a direction in which the bit lines BL1 and BL2 and the source line SL cross each other, and in this case, the bit lines BL1 and BL2 and the source line SL are formed on in different layers.

The source select line SSL1 and the source side word lines WL0 to WL7 are stacked between the source line SL and the pipe transistor PT, and a first vertical channel layer CH2 connected between the source line SL and the pipe transistor PT passes through the source select line SSL1 and the source side word lines WL0 to WL7. Multi layers (not shown) including a tunnel insulation layer, a charge storing layer, and a blocking insulation layer may be included in the first vertical channel layer CH2 and the source side word lines WL0 to WL7. The source select transistor SST1 and the memory cells C0 to C7 may be substantially perpendicularly formed at a portion at which the first vertical channel layer CH2 is surrounded by the source select line SSL1 and the source side word lines WL0 to WL7 on the substrate.

The drain select line DSL1 and the drain side word lines WL8 to WL15 are stacked between the bit line BL1 and the pipe transistor PT, and a second vertical channel layer CH2' connected between the bit line BL1 and the pipe transistor PT passes through the drain select line DSL1 and the drain side word lines WL8 to WL15. Multi layers (not shown) including a tunnel insulation layer, a charge storing layer, and a blocking insulation layer may be included in the second vertical channel layer CH2' and the drain side word lines WL8 to WL15. As described above, the drain select transistor DST1 and the memory cells C8 to C15 may be substantially perpendicularly formed at a portion at which the second vertical channel layer CH2' is surrounded by the drain select line DSL1 and the drain side word lines WL8 to WL15 on the substrate.

The multi layers (not shown) including the tunnel insulation layer, the charge storing layer, and the blocking insulation layer may also be formed between the pipe channel layer CH1 and the pipe gate PG.

The first vertical channel layer CH2 and the second vertical channel layer CH2' may be connected with each other by the pipe channel CH1 of the pipe transistor PT. Accordingly, the memory strings STRING1 to STRING4 may include the U-shaped vertical channel layers CH, respectively, and the drain select transistor DST1, the memory cells C0 to C15, and the source select transistor SST may be serially connected between the bit line BL1 and the source line SL in the U-shape. That is, the memory strings STRING1 to STRING4 may be connected in the U-shape between the bit line BL1 and the source line SL.

Referring to FIGS. 1 and 3 again, the peripheral circuits 120 to 160 are configured to perform an erase loop, a program loop, and a read operation of the memory cell C8 connected to the selected word line (for example, the word line WL8). The peripheral circuits includes the control circuit 120 for controlling the program loop, the read loop, and the erasing operation, and the operation circuits 130 to 160 configured to perform the program loop, the read loop, and the erasing operation under the control of the control circuit 120. The program loop includes a program operation and a program verification operation, and the program loop may be performed by an Increment Step Pulse Program (ISPP) method. The erase loop includes an erasing operation and an erase verification operation, and the erase loop may be performed by an Increment Step Pulse Erase (ISPE) method. In order to perform the program loop, the read loop, and the erasing operation, the operation circuits 130 to 160 are configured to selectively output a program voltage Vpgm, a read voltage Vread, an erase voltage Vers, the pass voltage Vpass, a verification voltage Vvfy, source voltages Vsl[1:0], drain select voltages Vdsl[n:0], source select voltages Vssl[m:0], a pipe gate voltage Vpg, and a bit line voltage to the local lines DSL1 and DSL2, WL0 to WL15, SSL1 and SSL2, PG, and SL and bit lines BL of the selected memory block under the control of the control circuit 120, and control precharge/discharge of the bit lines BL or sense voltages or current of the bit lines BL. Especially, in a case of a NAND flash memory device, the operation circuit includes the voltage supply circuit 130, the page buffer group 140, the column selection circuit 150, and the input/output circuit 160. Each component will be described in detail below.

The control circuit 120 outputs a voltage control signal CMDv for controlling the voltage supply circuit 130 so that desired levels of operation voltages for performing the program loop, the read loop, and the erasing operation may be generated in response to a command signal CMD input from the outside through the input/output circuit 160. Further, the control circuit 120 outputs PB control signals CMDpb for controlling page buffers (not shown) included in the page buffer group 140 in order to perform the program loop, the read loop, or the erase loop. Further, when an address signal ADD is input in the control circuit 120, the control circuit 120 outputs a row address signal RADD to the voltage supply circuit 130 by using the address signal ADD and outputs a column address signal CADD to the column selection circuit 150.

The voltage supply circuit 130 selectively generates necessary operation voltages Vpgm, Vread, Vers, Vpass, Vvfy, Vsl[1:0], Vdsl[n:0], Vssl[m:0], and Vpg according to the program loop, the read loop, or the erase loop of the memory cells in response to the voltage control signal CMDv of the control circuit 120, and outputs operation voltages to the local lines SSL, WL0 to WLn, DSL, and PG and the source line SL of the selected memory block in response to the row address signal RADD of the control circuit 120.

The page buffer groups 140 include a plurality of page buffers (not shown) connected to the memory array 110 through the bit lines BL. The page buffers selectively precharge the bit lines LB based on the PB control signal CMDpb of the control circuit 120 and data DATA to be stored in the memory cells during the program operation. The page buffer groups 140 precharge the bit lines BL based on the PB control signal CMDpb of the control circuit 120 during the program verification operation or the read operation, and then latch the data read from the memory cell by sensing voltage change or the current of the bit lines BL.

The column selection circuit 150 selects the page buffers included in the page buffer group 150 in response to the column address CADD output from the control circuit 120. That is, the column selection circuit 150 sequentially transmits data to be stored in the memory cells to the page buffers in response to the column address CADD. Further, the column selection circuit 150 selectively selects the page buffers in response to the column address CADD so that the data of the memory cells latched in the page buffers by the read operation may be output to the outside.

The input/output circuit 160 transmits the command signal CMD and the address signal ADD input from the outside to the control circuit 120. Furthermore, the input/output circuit 170 transmits the data DATA input from the outside to the column selection circuit 150 during the program operation or performs an operation of outputting the data read from the memory cells to the outside during the read operation.

Hereinafter, an operation of the aforementioned semiconductor memory device will be described.

When the memory cell (for example, the memory cell C8) included in the memory string (for example, the memory string STRING4) selected from the memory strings STRING1 to STRING4, the peripheral circuits 120 to 160 supplies a program permission voltage (for example, 0 V) to the second bit line BL2 connected with the selected memory string STRING4 and supplies a program inhibition voltage (for example, the voltage Vcc) to the first bit line BL1. Further, the peripheral circuits 120 to 160 supply the drain select voltage to the drain select line DSL2 in order to turn on the drain select transistor DST2 of the selected memory string STRING4. The drain select voltage may be supplied with the same level as that of the program inhibition voltage supplied to the second bit line BL2. The peripheral circuits 120 to 160 supply the source select voltage (for example, 0 V) to the source select line SSL1 and SSL2 in order to turn on the source select transistors SST1 and SST2. A power voltage may be supplied to the source line SL.

According to the aforementioned conditions, a channel region CD of the memory cell C8 included in the selected memory string STRING4 is discharged. Further, a channel region CC of the memory cell C8 included in the third memory string STRING3 is precharged. However, since the drain select transistors DST1 and the source select transistors SST1 of the first and second memory strings STRING1 and STRING2 are all turned on, channel regions CA and CB of the memory cells C8 included in the first and second memory strings STRING1 and STRING2 fail to be precharged and become a floating state.

In this state, the peripheral circuits 120 to 160 supply the pass voltage to the word lines WL0 to WL7 and WL9 to WL15 of the non-selected memory cells C0 to C7 and C9 to C15, and supply the program voltage to the word line WL8 of the selected memory cell C8. A threshold voltage of the memory cell C8 of the selected memory string STRING4 is increased by a difference between the program voltage and a voltage of the channel region CD. That is, the memory cell C8 of the selected memory string STRING4 is programmed. In the meantime, the channel voltage is increased by a boosting phenomenon at the channel regions CA, CB, and CC of the memory cells C8 of the non-selected memory strings STRING1 to STRING3. Accordingly, since the difference between the program voltage supplied to the word line WL8 and the channel voltages of the channel regions CA, CB, and CC, a threshold voltage of the memory cells C8 included in the non-selected memory strings STRING1 to STRING3 is not increased.

As described above, the peripheral circuits 120 to 160 in the embodiment of the present invention may prevent the threshold voltage of the memory cells C8 of the non-selected memory strings STRING1 to STRING3 from being changed by discharging the channel region CD of the memory cell 8 and precharging the channel regions CA, CB, and CC of the remaining cells C8 or making the channel regions CA, CB, and CC of the remaining cells C8 be in the floating state before supplying the program voltage to the memory cell (for example, the memory cell C8) included in the memory string (for example, the memory string STRING4) selected from the memory strings STRING1 to STRING4.

However, a channel boosting phenomenon is generated in the channel regions CA, CB, and CC by the pass voltage and the program voltage in a state where the channel region CC of the memory cell C8 is precharged only in the third memory string STRING3 among the non-selected memory strings STRING1 to STRING3 and the channel regions CA and CB of the memory cell C8 is not precharged in the first and second memory strings STRING1 and STRING2, so that the channel voltages of the channel regions CA, CB, and CC increased by the channel boosting phenomenon are changed. That is, the voltage of the precharged channel region CC of the memory cell C8 is boosted higher than the voltages of the channel regions CA and CB of other memory cells C8. That is, the channel voltages of the channel regions CA and CB of the memory cells C8 included in the first and second memory strings STRING1 and STRING2 are boosted lower compared to the precharged channel region C of the memory cell C8. Accordingly, a program disturbance in which the threshold voltages of the memory cells C8 included in the first and second memory strings STRING1 and STRING2 may be generated.

Hereinafter, another embodiment of the present invention capable of suppressing the program disturbance will be described.

Figure 4A:
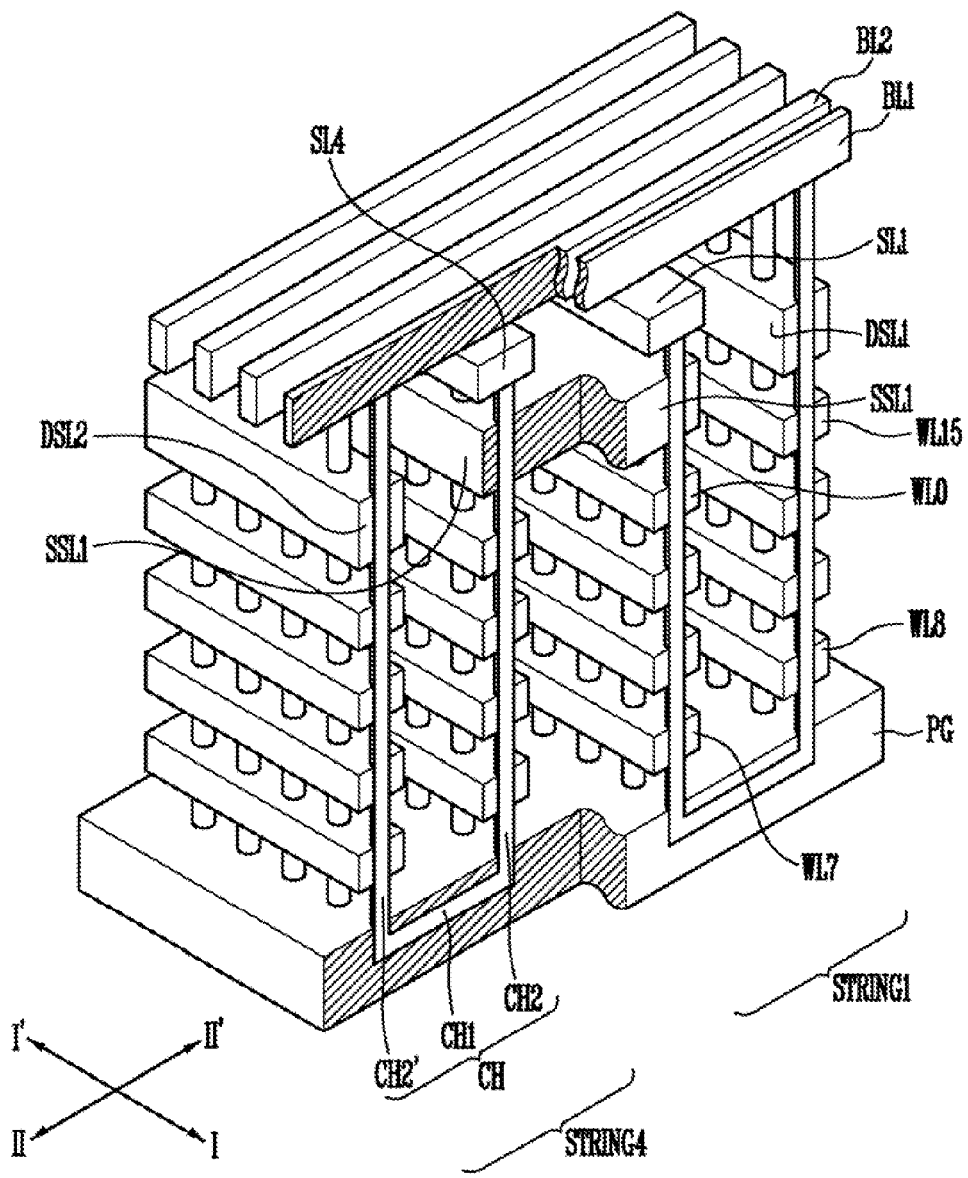
FIGS. 4A and 4B are views for illustrating another embodiment of the memory block having the three-dimensional structure illustrated in FIG. 1.
Figure 4B:
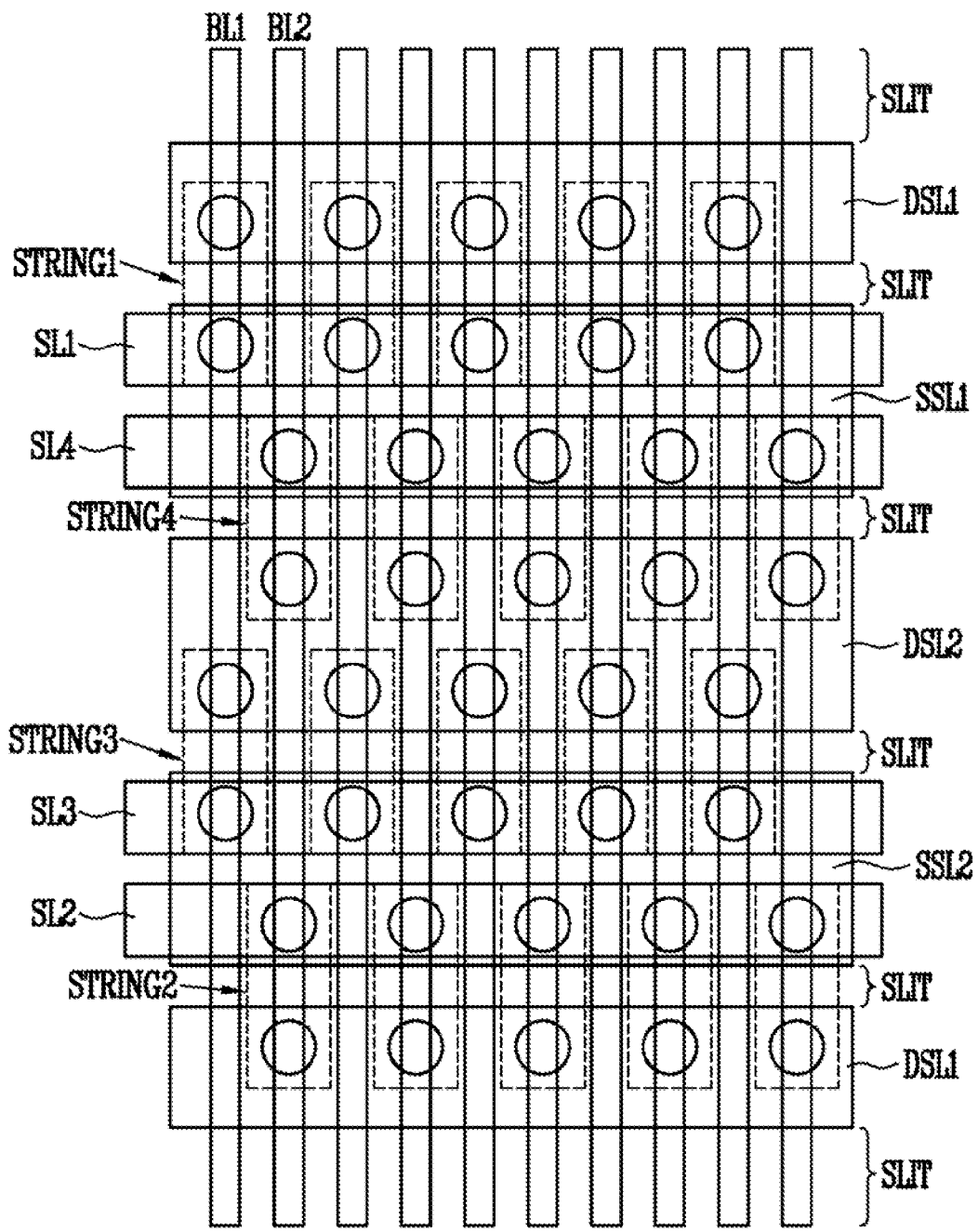
Figure 5:
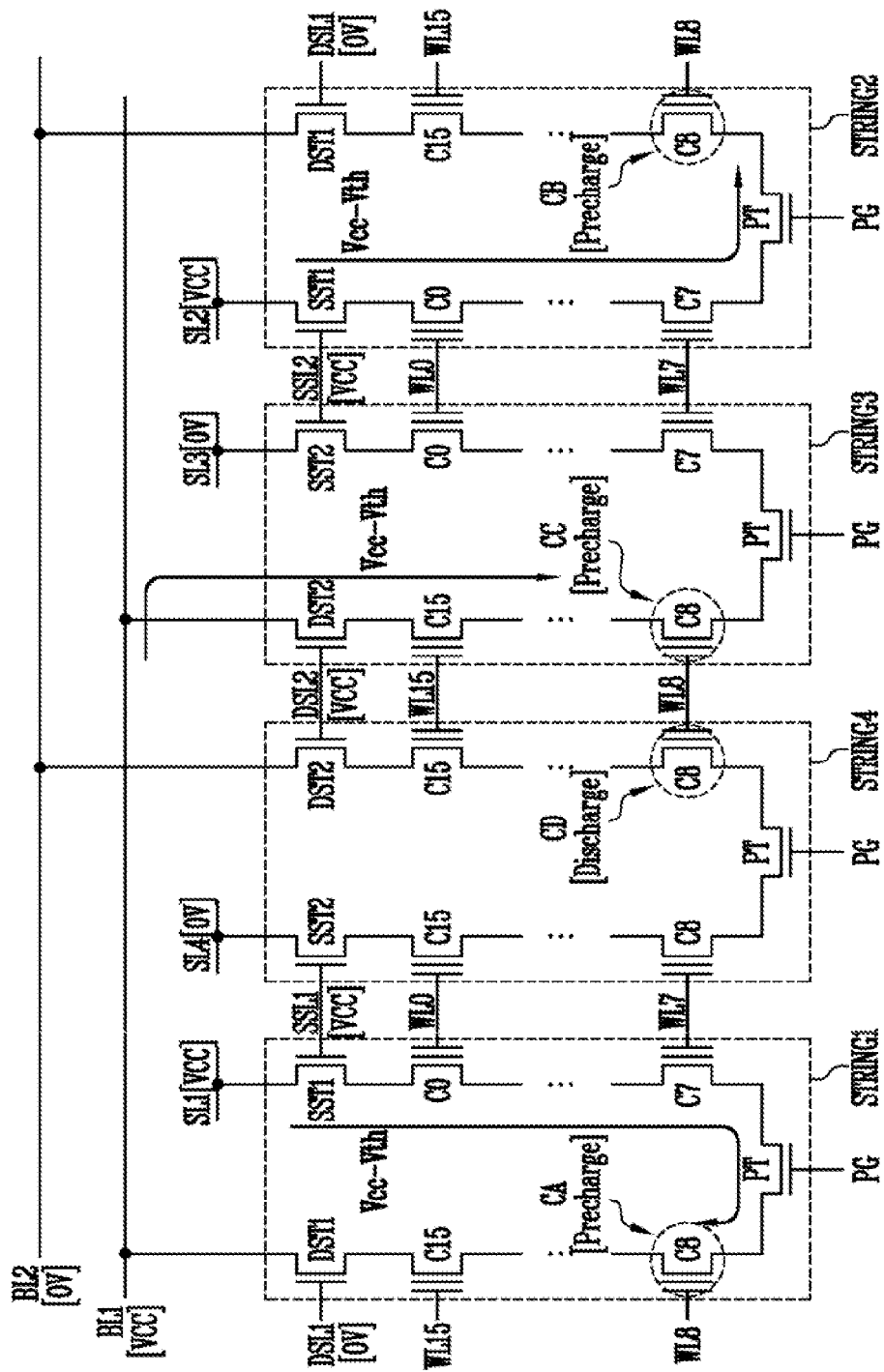
FIG. 5 is a circuit diagram for illustrating another embodiment of the memory block having the three-dimensional structure illustrated in FIGS. 4A and 4B.

FIGS. 4A and 4B are views for illustrating another embodiment of the memory block having the three-dimensional structure illustrated in FIG. 1. FIG. 5 is a circuit diagram for illustrating another embodiment of the memory block having the three-dimensional structure illustrated in FIGS. 4A and 4B;

Referring to FIGS. 4A, 4B, and 5, the memory block includes the memory strings STRING1 to STRING4, the bit lines BL1 and BL2, and the source lines SL1 to SL4.

If the memory block illustrated in FIGS. 4A, 4B, and 5 is compared with the memory block illustrated in FIGS. 2A, 2B, and 3, it is different in that the source lines SL1 to SL4 of the memory strings STRING1 to STRING4 are separated from each other.

Here, the source lines SL1 and SL4 of the memory strings STRING1 and STRING4 sharing the source select lines SSL1 of the source select transistors SST1 and SST2 among the memory strings STRING1 to STRING4 are isolated from each other. Further, the source lines SL3 and SL2 of the memory strings STRING3 and STRING2 sharing the source select lines SSL2 of the source select transistors SST1 and SST2 are isolated from each other.

However, the memory strings STRING4 and STRING3 sharing the drain select lines DSL2 of the drain select transistors DST2 share the source lines SL4 and SL3. That is, the memory strings STRING4 and STRING3 in which the source select lines SSL1 and SSL2 of the source select transistors SST2 are isolated share the source lines SL4 and SL3. That is, the source lines SL4 and SL3 of memory strings STRING4 and STRING3 are connected with each other.

Further, the memory strings STRING1 and STRING2 sharing the drain select lines DSL1 of the drain select transistors DST1 share the source lines SL1 and SL2. That is, the memory strings STRING1 and STRING2 in which the source select lines SSL1 and SSL2 of the source select transistors SST1 are isolated share the source lines SL1 and SL2. That is, the source lines SL1 and SL2 of the memory strings STRING1 and STRING2 are connected with each other.

The gates DSL1 and DSL2 of the drain select transistors DST1 and DST2 connected to the same bit line (for example, the bit line BL1) are isolated, and the gates SSL1 and SSL2 of the source select transistors SST2 sharing the source lines SL4 and SL3 are isolated.

Referring to FIGS. 1 and 5, the peripheral circuits 120 to 160 are configured to generate source select voltages Vssl[m:0] for differently controlling the source select transistors SST1 of the memory strings STRING1 and STRING2 sharing the source lines (for example, the source lines SL1 and SL2) within the memory block 110MB, respectively. The number of memory strings within the memory block 110MB may be changed according to a design, so that the number of source select voltages Vssl[m:0] generated in the peripheral circuits 120 to 160 may also be changed according to the number of memory strings.

Further, the peripheral circuits 120 to 160 are configured to generate drain select voltages Vdsl[n:0] for differently controlling the drain select transistors DST1 and DST2 connected to the same bit line (for example, the bit line BL1) within the memory block 110MB, respectively. Similarly, the number of memory strings within the memory block 110MB may be changed according to a design, so that the number of drain select voltages Vdsl[n:0] generated in the peripheral circuits 120 to 160 may also be changed based on the number of memory strings.

In order to precharge the channel regions of the non-selected memory strings STRING1 to STRING3, the peripheral circuits 120 to 160 are configured to turn on the source select transistor SST1 of the non-selected memory strings STRING1 to STRING2 connected with the source lines SL1 and SL2 to which the precharge voltage (for example, the precharge voltage Vcc) is supplied or turn on the drain select transistor DST2 of the non-selected memory string STRING3 connected to the bit line (for example, the bit line BL1) to which the program inhibition voltage (for example, the voltage Vcc) is supplied.

Further, when the memory cell C8 included in the selected memory string STRING4 is programmed, the peripheral circuits 120 to 160 may turn on the pipe transistors PT and the drain select transistor DST2 included in the selected memory string STRING4.

As described above, another embodiment of the present invention may employ a split structure in which the source lines SL1 to SL4 are separated in the memory block having a merged SSL structure in which two memory strings share one source select line. Further, since the peripheral circuits 120 to 160 control the voltages Vdsl[n:0], Vssl[m:0], and Vsl[1:0] supplied to the respective lines DSL1, DSL2, SSL1, SSL2, and SL1 to SL4, so that the channel regions CA, CB, and CC of the memory cells C8 may be prevented from becoming the floating state.

Specifically, the channel regions CA and CB of the non-selected memory strings STRING1 and STRING2 become the floating state in FIG. 3, but the channel region CA is precharged through the source select transistor SST1 from the source line SL1 in the first memory string STRING1 and the channel region CB is precharged through the source select transistor SST1 from the source line SL2 in the second memory string STRING2 as illustrated in FIG. 5.

Accordingly, the precharge voltages Vcc-Vth are all transmitted to the channel regions CA, CB, and CC of the non-selected memory strings STRING1 to STRING3, so that the pass voltage Vpass supplied to the non-selected word lines WL0 to WL7 and WL9 to WL15 and the channel voltages of the channel regions CA, CB, and CC supplied to the selected word line WL8 by the program voltage Vpgm are boosted to the similar level by the peripheral circuits 120 to 160.

In the meantime, even when the source select lines of the source select transistor included in the memory strings sharing the bit line in the memory block are isolated, all of the channel regions of the non-selected memory strings may be precharged, which will be described in detail below.

Figure 6A:
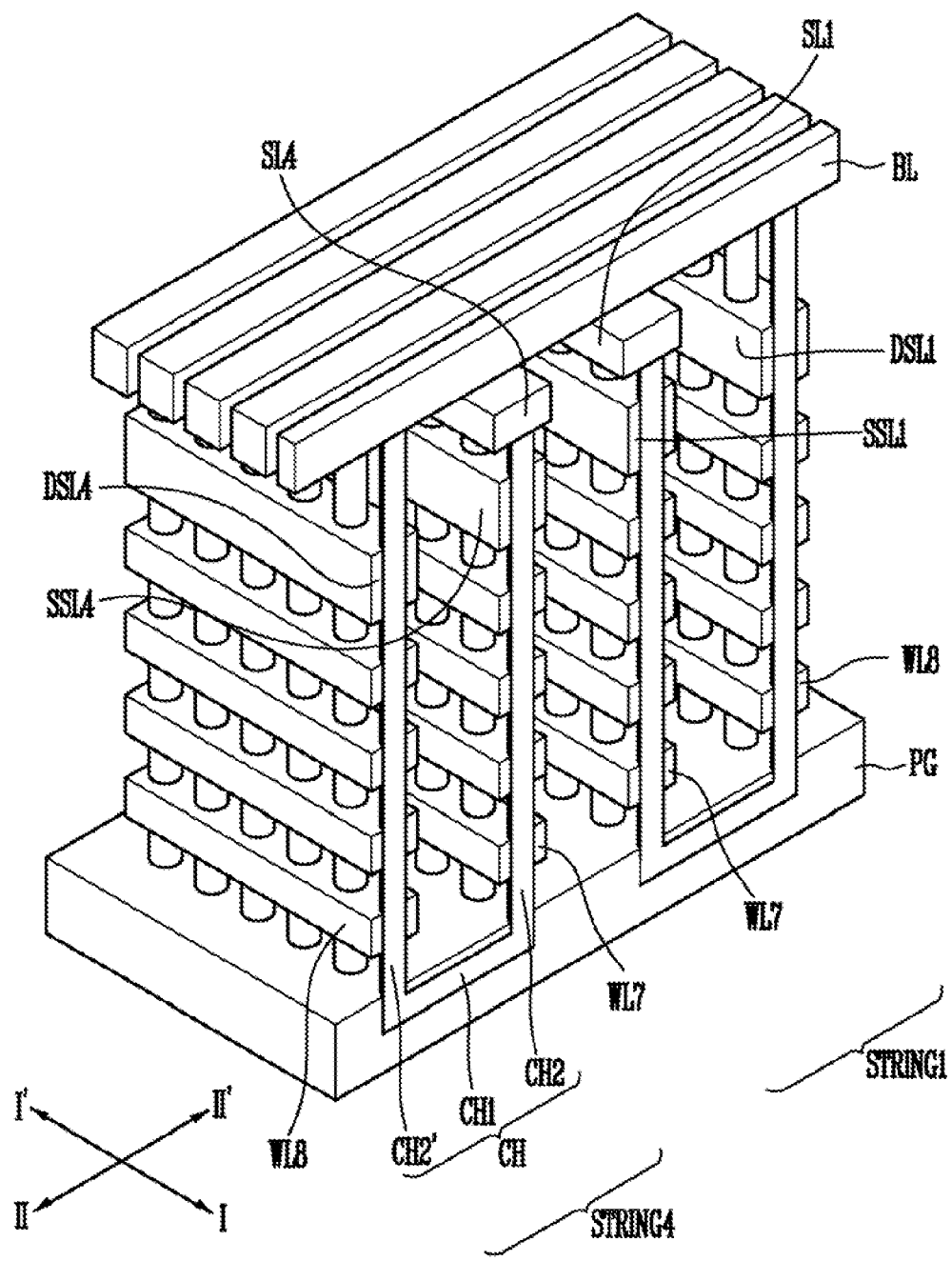
FIGS. 6A and 6B are views for illustrating yet another embodiment of the memory block having the three-dimensional structure illustrated in FIG. 1.
Figure 6B:
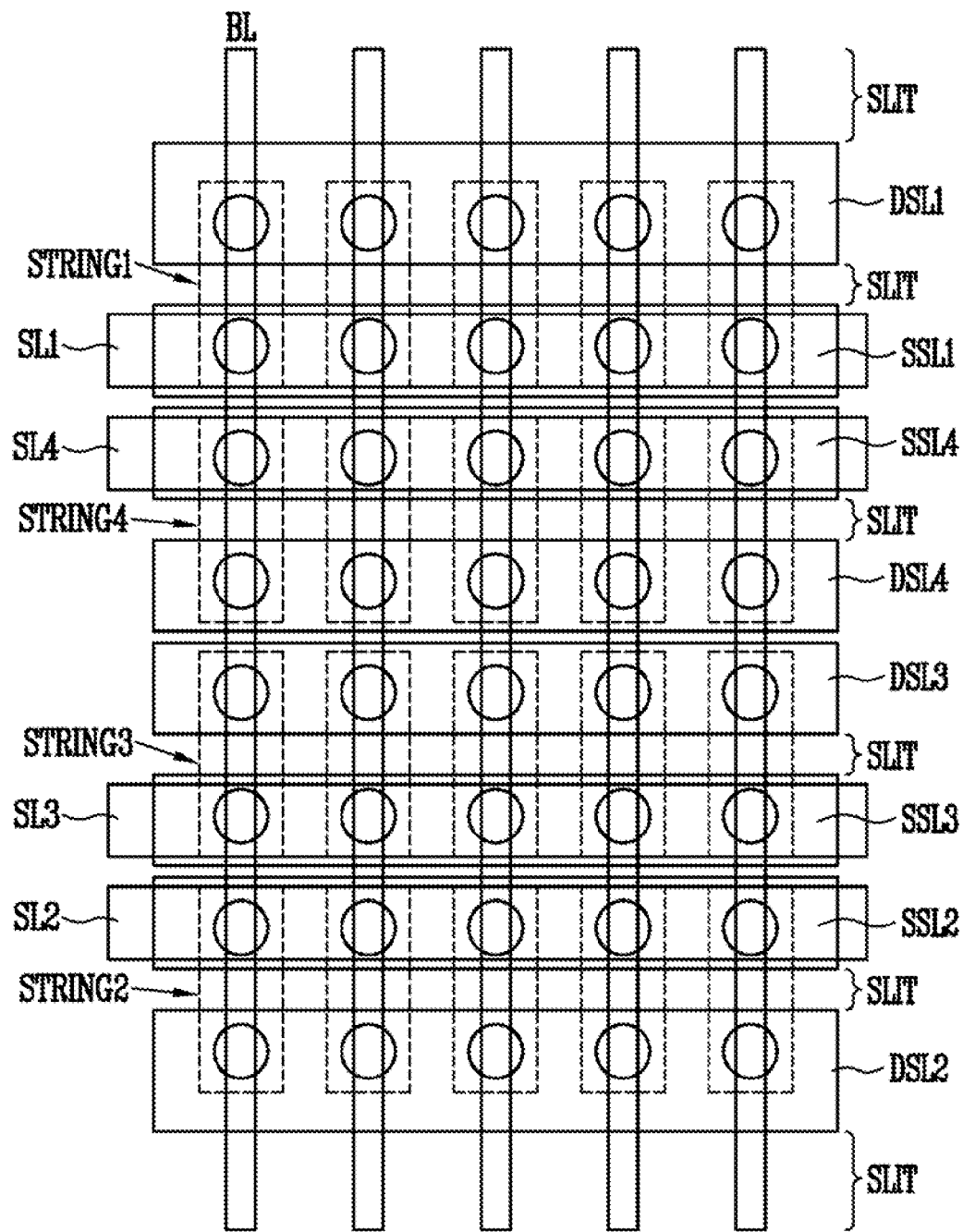
Figure 7:
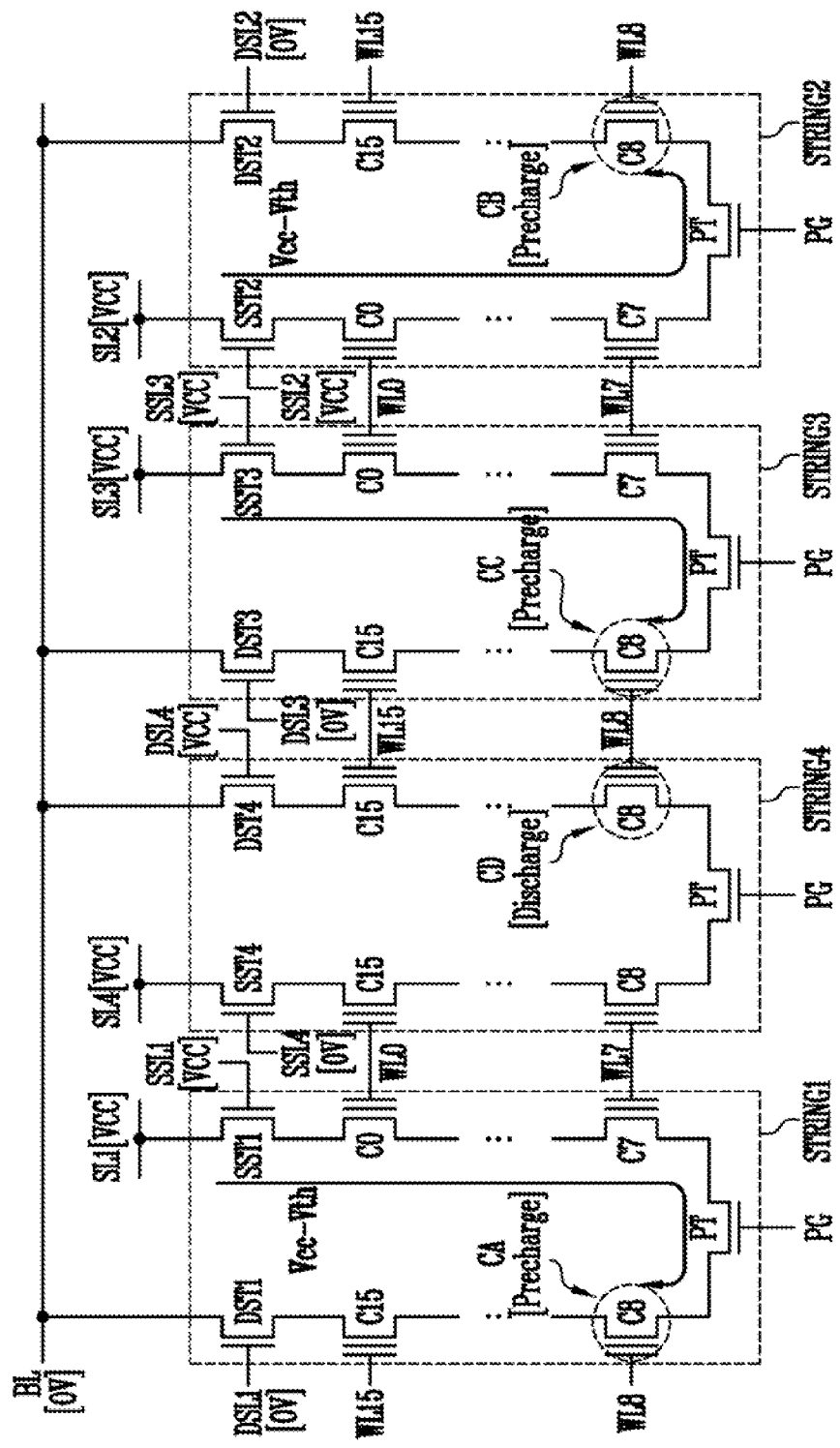
FIG. 7 is a circuit diagram for illustrating yet another embodiment of the memory block having the three-dimensional structure illustrated in FIGS. 6A and 6B.

FIGS. 6A and 6B are views for illustrating another embodiment of the memory block having the three-dimensional structure illustrated in FIG. 1. FIG. 7 is a circuit diagram for illustrating another embodiment of the memory block having the three-dimensional structure illustrated in FIGS. 6A and 6B.

Referring to FIGS. 6A, 6B, and 7, the memory block includes the memory strings STRING1 to STRING4, the bit lines BL, and the source lines SL1 to SL4.

If the memory block illustrated in FIGS. 6A, 6B, and 7 is compared with the memory block illustrated in FIGS. 4A, 4B, and 5, the memory strings STRING1 to STRING4 are arranged in a matrix form, not a zigzag form. Further, the drain select lines DSL1 to DSL4 corresponding to the gate of the drain select transistors DST1 to DST4 included in the memory strings STRING1 to STRING4 in the memory block are separated from each other, and the source select lines SSL1 to SSL4 corresponding to the gate of the source select transistors SST1 to SST4 are separated from each other. The plurality of source lines SL1 to SL4 is separated from each other in the memory block. However, because all of the select lines DSL1 to DSL4 and SSL1 to SSL4 are separated, the source lines SL1 to SL4 may be connected with each other.

Other structures are the same, but an operation method has a following difference.

Referring to FIGS. 1 to 7, because all of the select lines DSL1 to DSL4 and SSL1 to SSL4 are separated, the peripheral circuits 120 to 160 for controlling the source select transistors SST1 to SST4, respectively, output the source select voltages Vssl[m:0] corresponding to the source select transistors SST1 to SST4. The same precharge voltage (for example, the precharge voltage Vcc) may be supplied to the source lines SL1 to SL4. The program permission voltage (for example, 0 V) is supplied to the bit line BL by the peripheral circuits 120 to 160.

In this state, when the peripheral circuits 120 to 160 supplies the select voltages to the source select line SSL4 and the drain select line DSL4, respectively, in order to turn on the source select transistor SST4 and turn on the drain select transistor DST4 of the selected memory string STRING4, the channel region CD of the memory cell C8 of the selected memory string STRING4 is discharged. Then, when the peripheral circuits 120 to 160 supplies the select voltages to the source select line SSL1 to SSL3 and the drain select line DSL1 to DSL3, respectively, in order to turn on the source select transistors SST1 to SST3 and turn off the drain select transistor DST1 to DST3 of the non-selected memory strings STRING1 to STRING3, the channel regions CA, CB, and CC of the memory cell C8 of the non-selected memory strings STRING1 to STRING3 are discharged.

The precharge voltages Vcc-Vth are all transmitted to the channel regions CA, CB, and CC of the non-selected memory strings STRING1 to STRING3, so that the pass voltage Vpass supplied to the non-selected word lines WL0 to WL7 and WL9 to WL15 and the channel voltages of the channel regions CA, CB, and CC supplied to the selected word line WL8 by the program voltage Vpgm are boosted to the similar level by the peripheral circuits 120 to 160.

As described, by boosting the channel regions CA, CB, and CC of the non-selected memory strings STRING1 to STRING3 to the same level, the memory cell of the non-selected memory string may be prevented from being programmed due to the low boosting level.

Figure 8:
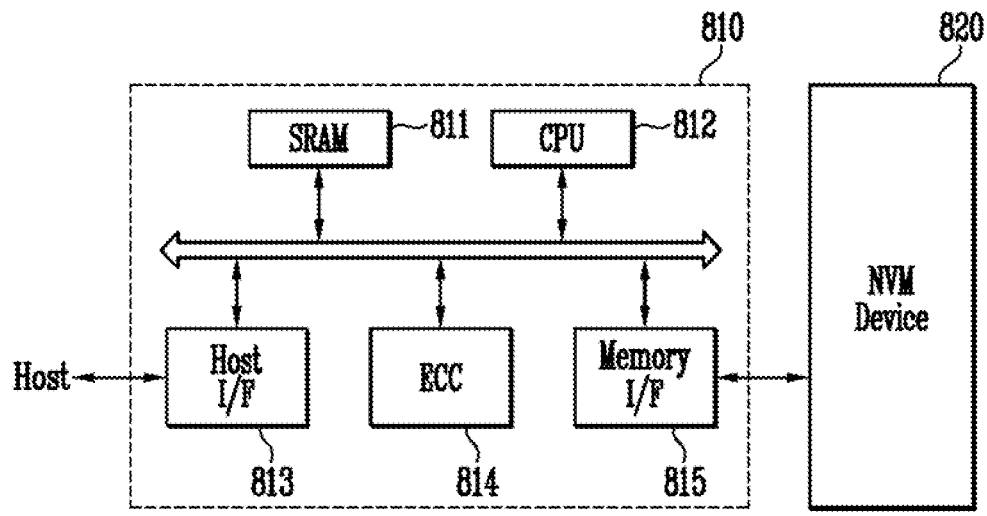
FIG. 8 is a block diagram schematically illustrating a memory system according to an embodiment of the present invention.

FIG. 8 is a block diagram schematically illustrating a memory system according to an embodiment of the present invention.

Referring to FIG. 8, a memory system 800 according to an embodiment of the present invention may include a non-volatile memory device 820 and a memory controller 810.

The non-volatile memory device 820 may include the aforementioned semiconductor memory device. The memory controller 810 may be configured so as to control the non-volatile memory device 820. A memory card or a semiconductor disk device (Solid State Disk: SSD) may be provided through a combination of the non-volatile memory device 820 and the memory controller 810. An SPAM 811 is used as an operation memory of a processing unit 812. A host interface 813 includes a data exchange protocol of a hose connected with the memory system 800. An error correction block 814 detects and corrects an error included in data read from the non-volatile memory device 820. A memory interface 814 interfaces with the non-volatile memory device 820 of the embodiment of the present invention. The processing unit 812 performs a general control operation for data exchange of the memory controller 810.

Although it is not illustrated in the drawing, it is apparent to those skilled in the art that a ROM (not shown) for storing code data for interfacing with the host may be further included in the memory system 800 according to the embodiment of the present invention. The non-volatile memory device 820 may be provided as a multi-chip package including a plurality of flash memory chips. The aforementioned memory system 800 of the embodiment of the present invention may be provided as a storage medium with high reliability with low error generation probability. Especially, the flash memory device of the embodiment of the present invention may be included in a memory system, such as a semiconductor disk device (Solid State Disk (SSD)), which has been recently actively researched. In this case, the memory controller 810 may be configured so as to communicate with an external device (for example, a host) through one among various interface protocols, such as USB, MMC, PCI-E, SATA, PATA, SCSI, ESDI, and IDE.

Figure 9:
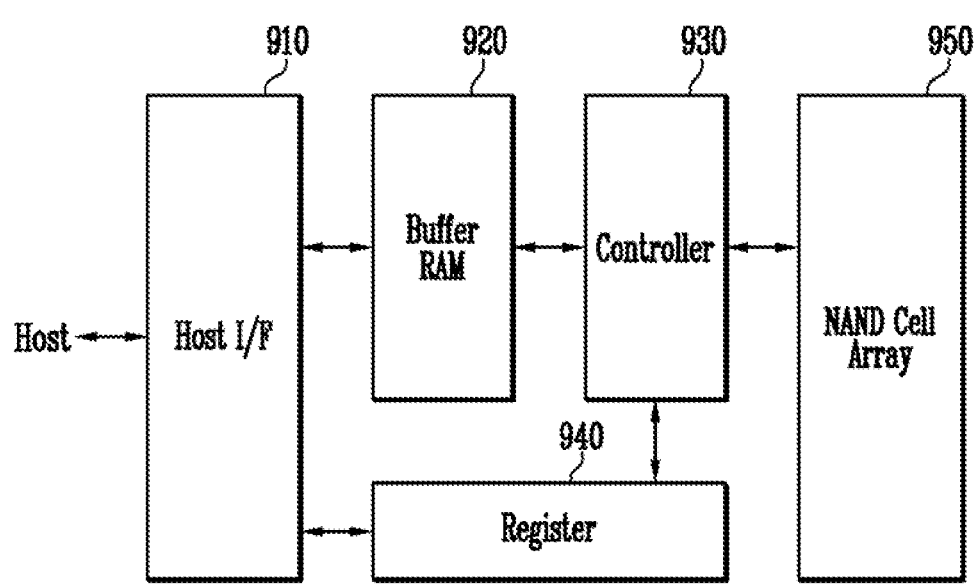
FIG. 9 is a block diagram schematically illustrating a fusion memory device or a fusion memory system performing a program operation according to the aforementioned various embodiments.

FIG. 9 is a block diagram schematically illustrating a fusion memory device or a fusion memory system performing a program operation according to the aforementioned various embodiments. For example, the technical characteristic of the embodiment of the present invention may be applied to a One NAND flash memory device 900 as a fusion memory device.

The One NAND flash memory device 900 may include a host interface 910 for exchanging various information with a device using a different protocol, a buffer RAM 920 including a code for driving the memory device or temporarily storing data, a controller 930 for controlling reading, a program, and all states in response to a control signal and a command provided from the outside, a register 940 for storing a command, an address, and data, such as configuration, for defining a system operation environment inside the memory device, and a NAND flash cell array 950 including an operation circuit including a non-volatile memory cell and a page buffer. The memory array illustrated in FIG. 2 is applied to a memory array of the NAND flash cell array 950.

Figure 10:
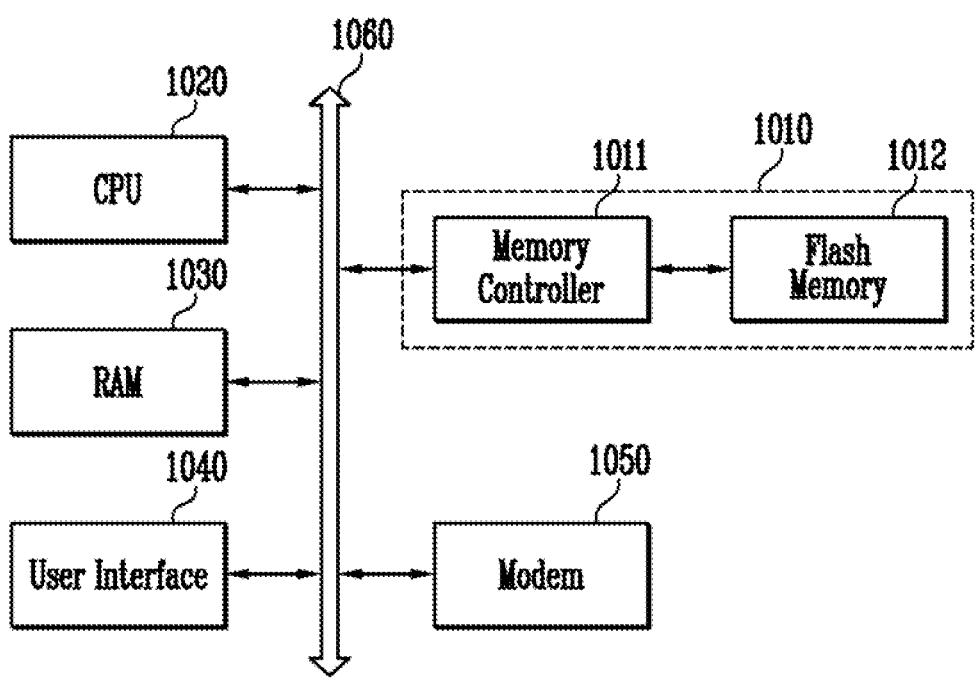
FIG. 10 is a block diagram schematically illustrating a computing system including a flash memory device according to an embodiment of the present invention.

FIG. 10 is a block diagram schematically illustrating a computing system including a flash memory device 1012 according to the embodiment of the present invention.

A computing system 1000 according to the embodiment of the present invention may include a microprocessor 1020 electrically connected to a system bus 1060, a RAM 1030, a user interface 1040, a modem 1050, such as a baseband chipset, and a memory system 1010. When the computing system 1000 according to the embodiment of the present invention is a mobile device, a battery (not shown) for supplying an operation voltage of the computing system 1000 may be additionally provided. Although it is not illustrated in the drawing, it is apparent to those skilled in the art that the computing system 1000 according to the embodiment of the present invention may further include an application chipset, a Camera Image Processor (CIS), a mobile DRAM, and the like. The memory system 1010 may include, for example, a Solid State Drive/Disk (SSD) using a non-volatile memory for storing data. Otherwise, the memory system 1010 may be provided as a fusion flash memory (for example, a One NAND flash memory).

As described above, the embodiments of the present invention have been disclosed in the drawings and the specification. The specific terms used herein are for purposes of illustration, and do not limit the scope of the present invention defined in the claims. Accordingly, those skilled in the art will appreciate that various modifications and another equivalent examples may be made without departing from the scope and spirit of the present disclosure. Therefore, the sole technical protection scope of the present invention will be defined by the technical spirit of the accompanying claims.

What is claimed is:

1. A semiconductor memory device, comprising:
   memory strings each of which comprises a drain select transistor, memory cells, and a source select transistor, which are substantially perpendicularly disposed over a substrate;
   a first bit line coupled to drain select transistors of first group memory strings among the memory strings;
   a second bit line coupled to drain select transistors of second group memory strings among the memory strings;
   source lines coupled to source select transistors of the memory strings, respectively; and
   peripheral circuits configured to turn on source select transistors of non-selected memory strings coupled to source lines to which a precharge voltage is supplied, or turn on drain select transistors of non-selected memory strings coupled to bit lines to which a program inhibition voltage is supplied in order to precharge channel regions of non-selected memory strings before a program voltage is supplied to a memory cell included in a selected memory string among the memory strings,
   wherein the source select transistors of the memory strings coupled to different bit lines are coupled to a same source line, and
   wherein the source select transistors of the memory strings coupled to the same bit line are coupled to different source lines.

2. The semiconductor memory device of claim 1, wherein the first group memory strings and the second group memory strings are arranged to be inconsistent with each other.

3. The semiconductor memory device of claim 1, wherein the memory strings further comprise pipe transistors formed over the substrate, and a part of the memory cells is substantially perpendicularly connected between each of the pipe transistors and the drain select transistor and other memory cells are substantially perpendicularly connected between each of the pipe transistors and the source select transistor.

4. The semiconductor memory device of claim 3, wherein when the memory cell included in the selected memory string is programmed, the peripheral circuits turn on the pipe transistors.

5. The semiconductor memory device of claim 1, wherein when the memory cell included in the selected memory string is programmed, the peripheral circuits turn on the drain select transistor included in the selected memory string.

6. The semiconductor memory device of claim 1, wherein the first group memory strings and the second group memory strings among the memory strings are arranged in a symmetric structure.

7. The semiconductor memory device of claim 1, wherein the source lines of the memory strings sharing the source select line of the source select transistors among the memory strings are isolated from each other, and memory strings sharing the drain select lines of the drain select transistors share the source lines.

8. The semiconductor memory device of claim 7, wherein the memory cells included in the memory strings share word lines,
   gates of the drain select transistors connected to an identical bit line are separated, and
   gates of the source select transistors sharing the source line are separated.

9. The semiconductor memory device of claim 7, wherein the peripheral circuits are configured to generate source select voltages for differently controlling the source select transistors of the memory strings sharing each source line within a memory block, respectively.

10. The semiconductor memory device of claim 1, wherein the peripheral circuits are configured to generate drain select voltages for differently controlling drain select transistors connected to an identical bit line within a memory block, respectively.

11. A semiconductor memory device, comprising:
    memory strings each of which comprises a drain select transistor, memory cells, and a source select transistor, which are substantially perpendicularly disposed over a substrate;
    bit lines coupled to drain select transistors included in the memory strings;
    source lines coupled to source select transistors included in the memory strings, respectively; and
    peripheral circuits configured to supply a precharge voltage to the source lines and turn on source select transistors of non-selected memory strings in order to precharge channel regions of the non-selected memory strings before a program voltage is supplied to a memory cell included in a selected memory string among the memory strings, wherein the source select transistors of the memory strings coupled to different bit lines are coupled to a same source line, and wherein the source select transistors of the memory strings coupled to the same bit line are coupled to different source lines.

12. The semiconductor memory device of claim 11, wherein the memory strings further comprise pipe transistors formed over the substrate, and a part of the memory cells is substantially perpendicularly connected between each of the pipe transistors and the drain select transistor and other memory cells are substantially perpendicularly connected between each of the pipe transistors and the source select transistor.

13. The semiconductor memory device of claim 12, wherein when the memory cell included in the selected memory string is programmed, the peripheral circuits turn on the pipe transistors.

14. The semiconductor memory device of claim 11, wherein when the memory cell included in the selected memory string is programmed, the peripheral circuits turn on the drain select transistor included in the selected memory string.

15. The semiconductor memory device of claim 11, wherein the memory cells included in the memory strings share word lines, gates of the drain select transistors connected to an identical bit line are separated, and gates of the source select transistors connected to the source lines, respectively, are separated.

16. The semiconductor memory device of claim 15, wherein the source lines are connected with each other.

17. The semiconductor memory device of claim 11, wherein the peripheral circuits are configured to generate source select voltages to source select transistors for differently controlling operations of the source select transistors, respectively.

18. The semiconductor memory device of claim 17, wherein the peripheral circuits equally control voltages of the source lines.

19. The semiconductor memory device of claim 11, wherein the peripheral circuits are configured to generate drain select voltages to the drain select transistors for differently controlling operations of the drain select transistors, respectively.

20. The semiconductor memory device of claim 11, wherein the first group memory strings and the second group memory strings among the memory strings are arranged in a symmetric structure.

21. A semiconductor memory device, comprising:

memory strings each of which connects a drain select transistor, memory cells, and a source select transistor in series;

a first bit line coupled to drain select transistors of first group memory strings among the memory strings;

a second bit line coupled to drain select transistors of second group memory strings among the memory strings; and source lines coupled to source select transistors of the memory strings, respectively, wherein the memory cells of non-selected memory strings among the memory strings are in precharge state or in floating state, before a program voltage is supplied to a memory cell of a selected memory string, wherein the source select transistors of the memory strings coupled to different bit lines are coupled to a same source line, and wherein the source select transistors of the memory strings coupled to the same bit line are coupled to different source lines.

* * * * *